United States Patent [19]
Küng

[11] Patent Number: 5,057,716
[45] Date of Patent: Oct. 15, 1991

[54] LINEARLY COMPENSATED SLOPE MULTIPLIER

[76] Inventor: Martin Küng, Judavollastrasse 24, Bürs, Austria, 6706

[21] Appl. No.: 383,183

[22] Filed: Jul. 21, 1989

[51] Int. Cl.$^5$ .......................... G06G 7/12; G06G 7/14; H03K 5/153
[52] U.S. Cl. .................................... 307/491; 307/494; 307/350; 307/359; 328/146
[58] Field of Search ............... 307/491, 493, 494, 529, 307/350, 455, 467, 443, 359, 264; 328/146

[56] References Cited

U.S. PATENT DOCUMENTS

| | | | |
|---|---|---|---|
| 4,586,155 | 4/1986 | Gilbert | 364/841 |
| 4,883,987 | 5/1988 | Fattaruso | 307/491 |

OTHER PUBLICATIONS

*Semiconductor Circuit Technology*, FIG. 4.41, Tietze and Schenk, Springer Verlag Publishers, 6th Edition, p. 67.
*Semiconductor Circuit Technology*, FIG. 4.44, Tietze and Schenk, Springer Verlag Publishers, 6th Edition, p. 72.
*Semiconductor Circuit Technology*, FIG. 12.37, Tietze and Schenk.
National Semiconductor Linear Databook 1982, pp. 3-170.

*Primary Examiner*—Stanley D. Miller
*Assistant Examiner*—Trong Phan
*Attorney, Agent, or Firm*—Brown, Martin, Haller & McClain

[57] ABSTRACT

An electronic multiplier circuit in which a first differential amplifier is introduced into the negative feedback of an input amplifier, an input of the first differential amplifier is connected to an input of a second differential amplifier and the collectors of the second differential amplifier are connected to an output amplifier theoretically incorporates the best conditions for an ideal multiplying function. The fact that this is not quite so is caused by the so-called emitter bulk resistance which is present in real transistors. It effects a negative feedback in both differential amplifiers which depends upon the magnitude of the control currents. As a result, the transmission characteristics coincide only when the control currents for both differential amplifiers are equally great. Only then is the functioning of the circuit ideal. The present invention offers a solution whereby, as shown in FIG. 1, a portion of the output voltage ($\mu A$) is connected to the second input (D) of the second differential amplifier (D2) and a portion of the input voltage ($\mu E$) is connected to the second input (B) of the first differential amplifier (D1) thus creating an ideal multiplier circuit.

6 Claims, 3 Drawing Sheets

LINEARLY COMPENSATED SLOPE MULTIPLIER

A large part of the electronic multiplier circuits used today is based in principle on the function of a differential amplifier with two transistors, whose amplification is theoretically proportional to the sums of the collector currents (see Tietze and Schenk, Halbleiterschaltungstechnik/Semiconductor Circuit Technology, Springer Verlag Publishers, 6th edition, FIG. 4.41). The most obvious disadvantage of this circuit is the non-linearity of the transmission characteristic (FIG. 4.44 in). This error source can be eliminated by using a differential amplifier introduced into the negative feedback of an amplifier to compensate the transmission characteristic of a second, similar differential amplifier whereby the input of the second differential amplifier is connected in parallel with the input of the first differential amplifier and whereby the signal applied to the collectors of the second differential amplifier is prepared by means of an output amplifier. Such solution was published for example in Linear Databook 1982 by National Semiconductor on Page 3 170, bottom. In a circuit executed in accordance with page 3-170 of the National Semiconductor Linear Databook 1982 referred to above, the impact of non-linearity can indeed be kept very small, but only if either control currents for both differential amplifiers are maintained very small or if the control currents are equally great ("control currents" refers here to the currents which discharge through the common emitter connections and which, as a result, affect amplification). With increasing deviation, non-linearity multiplies with increasing values for the control currents.

The cause of this disturbing effect is the inner resistance in the emitter, which occurs in real transistors, the socalled emitter bulk resistance (referred to as such in the English-language literature). This resistance (R-Eb) acts in principle as an emitter resistance and effects within the two differential amplifiers from page 3-170 of the National Semiconductor Linear Databook 1982 referred to above a negative feedback dependent upon the product of control current times R-Eb as well as transmission characteristics dependent thereon. This means that transmission characteristics compensate only when the product of control current times R-Eb is equally great for both differential amplifiers from page 3-170 of the National Semiconductor Linear Databook 1982 referred to above. Otherwise there occurs a non-linearity which depends on the size of the deviation and which, as input signal, effects the occurrence of cubic distortions in alternating voltages. Such an inner resistance also occurs in simple multiplier circuits of the type illustrated in FIG. 12.37 of Tietze and Schenck, Halbleiterschaltungstechnik/Semiconductor Circuit Technology, 6th Edition, referred to above, producing undesirable distortions.

The compensation of undesirable negative feedback takes place logically through positive feedback of equal size, thereby already addressing the essence of the present invention.

SUMMARY DESCRIPTION OF DRAWINGS

Figure 1:
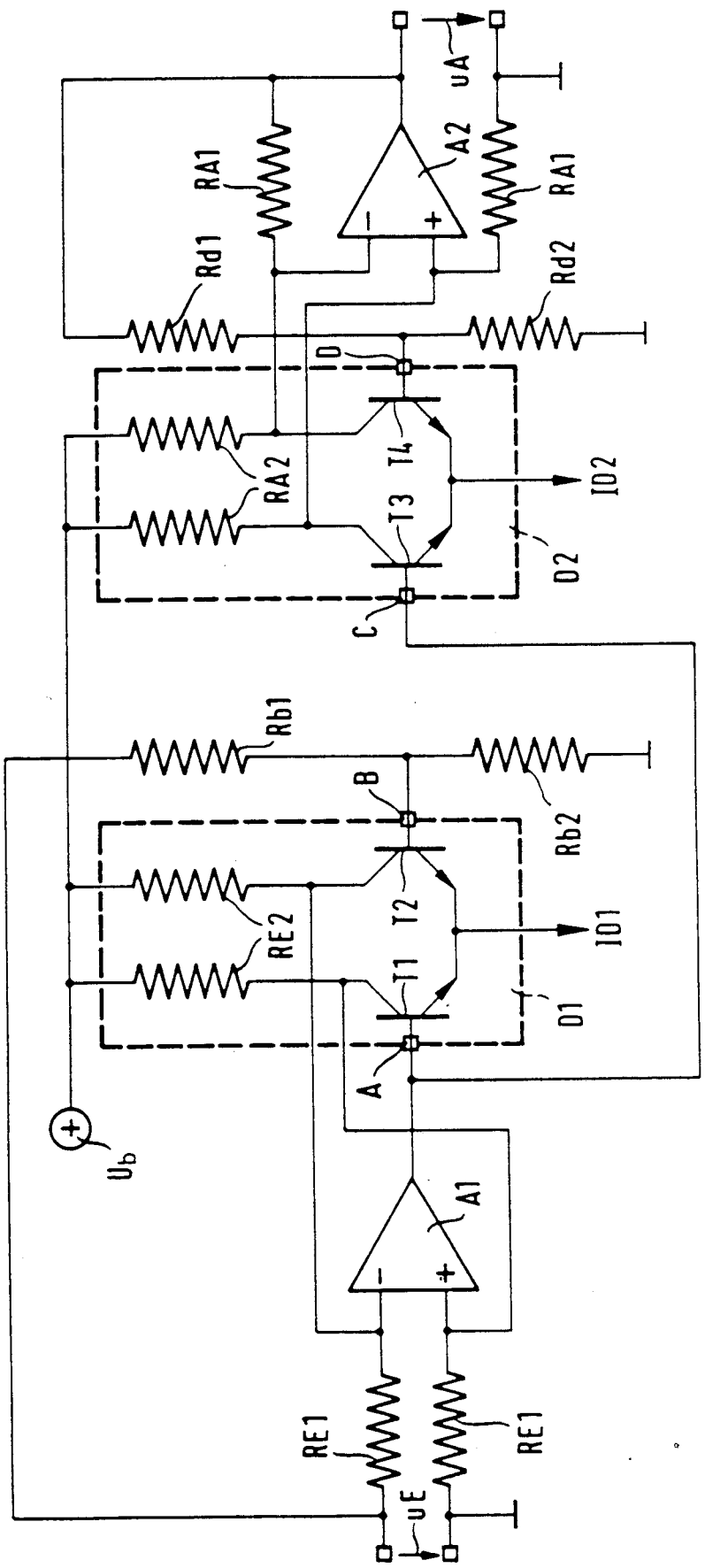
FIG. 1 illustrates an electronic multiplier circuit with compensation for non-linearity according to a first embodiment of the present invention.

FIG. 1 is a further description of one of the possible versions for the elimination of non-linearity in multiplier circuits caused by emitter bulk resistance whereby an input signal is applied to an input amplifier, in whose negative feedback is arranged a first differential amplifier and an input of the first differential amplifier is connected to an input of the second differential amplifier, and whereby further the collectors of the second differential amplifiers are connected to the inputs of an output amplifier and multiplication of the input signal takes place with a factor through control of the current in the emitter branches. Through two voltage dividers, Rb1, Rb2 and Rd1, Rd2, a proportional portion of input signal (uE) is applied to the second input (B) of the first differential amplifier (D1) and a proportional portion of the output signal (uA) is applied to the second input (D) of the second amplifier (D2). In the second differential amplifier, a coupling is made from the output to the input of differential amplifier D2 via the voltage divider Rd1, Rd2. The magnitude of the compensation voltage coupled to input D will be dependent on the magnitude of the output voltage, and therefore upon the control current ID2. The conditions are slightly different for the first differential amplifier (D1): with increasing control current ID1, negative feedback increases via input amplifier (A1) so that output voltage of A1 decreases with steady input signal (uE), so that the signal applied to input B of transistor T2 remains the same, thus causing the signal in D1 at the second input (B) to increase relative to the signal applied to input A, when ID1 is increased. In other words, it is certain for both differential amplifiers that the magnitude of the compensation voltages depends upon the respective control current ID1 or ID2. Since it can also be assumed that the emitter bulk resistances are for the most part independent of the control currents, the harmful negative feedback caused by R-Eb can be virtually compensated when both voltage dividers Rb1, Rb2 and Rd1, Rd2 are set properly.

Figure 2:
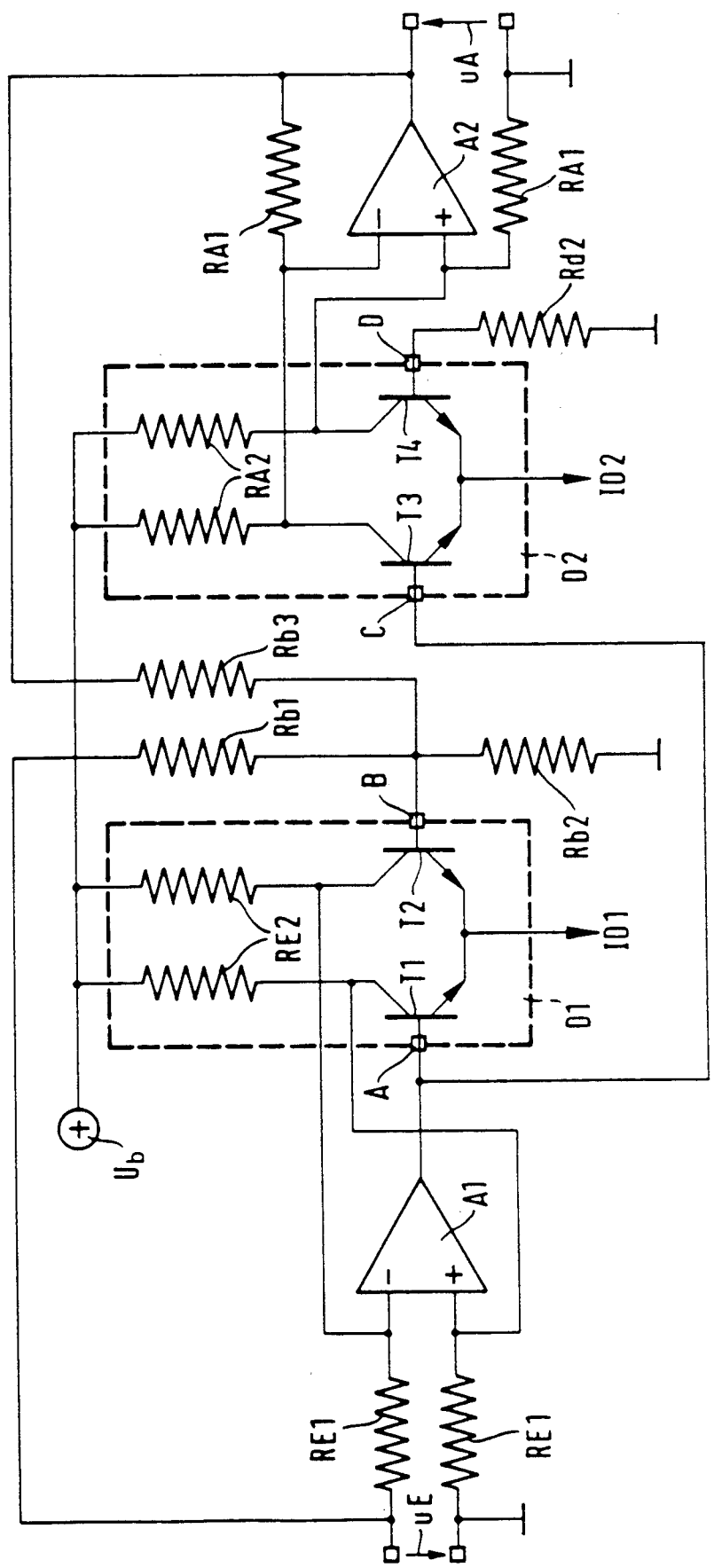
FIG. 2 illustrates a modified embodiment of the invention in a multiplier circuit similar to FIG. 1 but providing greater control of the control current or a fixed control current for the first differential amplifier.

The following reason is responsible for the fact that compensation of R-Eb in accordance with FIG. 1 is not 100%: the disturbing negative feedback does not only work for the signals applied to the first inputs (A, C) of the two differential amplifiers but also to the same extent for the compensation signals applied to the second inputs (B, D), thus causing a residual amplification error V-R to remain. The effect of V-R depends upon the respective control currents for which both voltage dividers (Rb1, Rb2 and Rd1, Rd2) are set at the lowest non-linearity, and increases with greater maximum values for both control currents. For this reason, the compensation of R-Eb shown in FIG. 2 has an advantage over the compensation shown in FIG. 1 when ID1 has an invariable fixed value. Indeed, V-R for the first differential amplifier is then constant, and when the output amplifier as shown in FIG. 2 has inverted wiring compared to FIG. 1, the proportional portion of uA at input B can be added to the proportional portion of uE. As a result, when ID1 is constant for both compensation voltages, an equally great and constant V-R is in effect which can be taken into account when setting Rb1 and Rb3 so that compensation of R-Eb is now 100% possible.

As a welcome additional effect, the emitter bulk resistance compensations shown in FIGS. 1 and 2 also reduce or eliminate the non-linearity of the control current's overall amplification characteristic, also caused by the negative feedback in both differential amplifiers increasing with rising control currents.

There are applications in which not a reduction but a targeted boost of the cubic distortion is desirable. This is very often used for musician amplifiers in order to achieve a better sound. When a proportional portion of uE is applied to input D, the cubic distortion level can be set in the corresponding portion of uE so that the "soft" overshooting behavior of tube amplifiers can be reproduced. In addition, when using the circuit to affect the dynamics behavior of the most different signal sources, the cubic distortion can also be affected at will with the same component.

Figure 3:
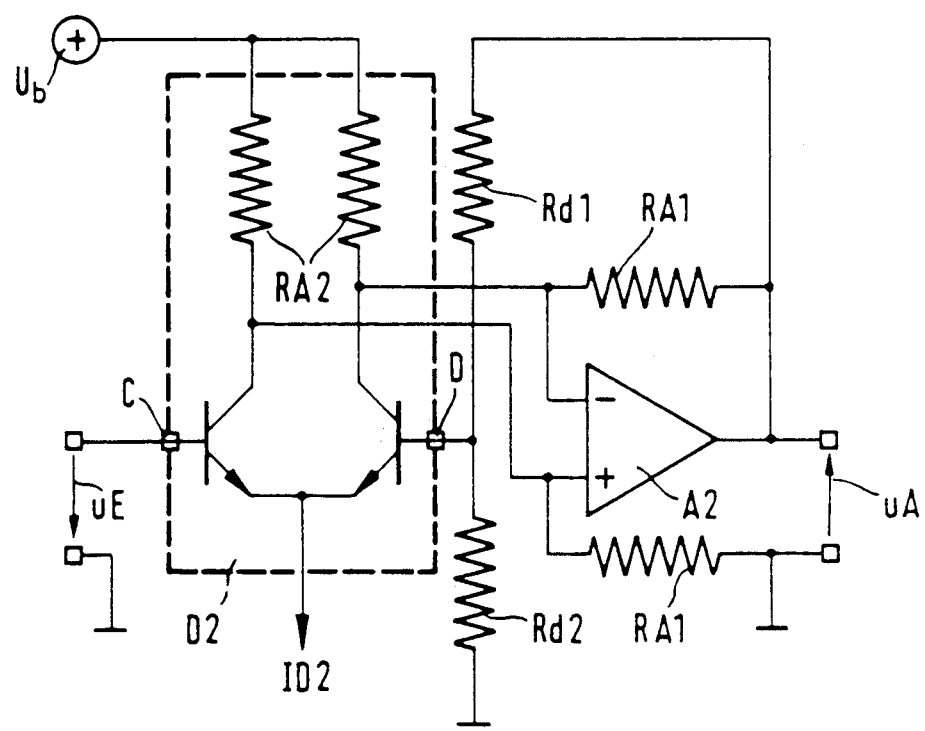
FIG. 3 illustrates a simple multiplier circuit with compensation according to another embodiment of the invention.

Finally, FIG. 3 also shows how the properties of simple multiplier circuits can be improved through compensation of R-Eb: As in the second differential amplifier (D2) of FIG. 1, FIG. 3 shows the compensation of the harmful negative feedback through positive feedback via voltage divider Rd1, Rd2, and the resulting linearization of the control current's overall amplification characteristic. As in the first embodiment, a portion of the output signal uA is connected via voltage divider Rd1, Rd2 to the second input D of differential amplifier D2. Compensation occurs dependent on the magnitude of the output signal and therefore upon the control current Id2 via A2, the voltage divider, and the input D of one of the transistors. Thus, the harmful negative feedback caused by R-Eb can be virtually compensated when the voltage divider Rd1, Rd2 is set properly.

Component values (example) for FIG. 1:

RE1=RE2=RA1=RA2=1 kOhm

Rb2=Rd2=10 Ohm

Rb1=Rd1=appr. 40 kOhm (R-Eb of T1-4=appr. 0.5 Ohm).

I claim:
1. Electronic multiplier circuit in which an input signal is applied to input terminals of an input amplifier, a first input of a first differential amplifier is connected to a first input of a second differential amplifier, collectors of the first differential amplifier are connected with said input terminals of the input amplifier and collectors of the second differential amplifier are connected with inputs of an output amplifier, at whose output an output signal is collected, whereby an output of the input amplifier is connected to said first inputs of the first and second differential amplifiers, a proportional portion of the input signal is applied to a second input of the first differential amplifier and a proportional portion of the output signal of said output amplifier is applied to a second input of the second differential amplifier.

2. The circuit as claimed in claim 1, wherein said first compensation means comprises a first voltage divider connected between said input and the second input of said first differential amplifier.

3. Electronic multiplier circuit in which an input signal is applied to input terminals of an input amplifer; a first differential amplifier having a first input being connected to a first input of a second differential amplifier, collectors of the first differential amplifier are connected with the input terminals of the input amplifier and collectors of the second differential amplifier are connected with inputs of an output amplifier, whereby an output of the input amplifier is connected to the first inputs of the first and second differential amplifier, a proportional portion of the input signal is applied to a second input of the first differential amplifier and a proportional portion of an output signal of the output amplifier is also applied to the second input of the first differential amplifier.

4. An electronic multiplier circuit, comprising:
an input amplifier having inputs for receiving an input signal;
a first differential amplifier having first and second inputs, the first input being connected to the output of said input amplifier;
a second differential amplifier having first and second inputs, the first input being connected to the output of said input amplifier;
an output amplifier having inputs connected to collectors of said second differential amplifier and an output for transmitting an output signal from said circuit;
the inputs of the input amplifier being connected to the collectors of said first differential amplifier;
first compensation means for connecting a proportional portion of the input signal to the second input of said first differential amplifiers; and
second compensation means for connecting a proportional portion of said output signal to the second input of one of said first and second differential amplifiers.

5. The circuit as claimed in claim 4, wherein said second compensation means comprises a voltage divider connected between said output and the second input of said first differential amplifier.

6. The circuit as claimed in claim 4, wherein said second compensation means comprises a voltage divider connected between said output and the second input of said second differential amplifier.

* * * * *